United States Patent [19]

Shiratake et al.

[11] Patent Number: 5,703,817
[45] Date of Patent: Dec. 30, 1997

[54] SEMICONDUCTOR MEMORY DEVICE

[75] Inventors: Shinichiro Shiratake, Tokyo; Daisaburo Takashima, Yokohama; Kenji Tsuchida, Kawasaki; Tsuneo Inaba, Ichikawa, all of Japan

[73] Assignee: Kabushiki Kaisha Toshiba, Kawasaki, Japan

[21] Appl. No.: 748,779

[22] Filed: Nov. 14, 1996

[30] Foreign Application Priority Data

Nov. 17, 1995 [JP] Japan ................... 7-299939

[51] Int. Cl.$^6$ .................. G11C 7/00; G11C 29/00
[52] U.S. Cl. .................. 365/200; 365/225.7; 371/10.2; 371/10.3
[58] Field of Search .................. 365/200, 201, 365/225.7; 371/10.2, 10.3

[56] References Cited

U.S. PATENT DOCUMENTS

| | | | |
|---|---|---|---|
| 5,293,348 | 3/1994 | Abe | 365/200 |
| 5,392,246 | 2/1995 | Akiyama et al. | 365/200 |
| 5,394,368 | 2/1995 | Miyamoto | 365/225.7 |
| 5,475,648 | 12/1995 | Fujiwara | 365/200 |
| 5,487,039 | 1/1996 | Sukegawa | 365/200 |
| 5,570,318 | 10/1996 | Ogawa | 365/200 |

FOREIGN PATENT DOCUMENTS

| | | |
|---|---|---|
| 1-285097 | 11/1989 | Japan. |
| 2-210692 | 8/1990 | Japan. |

*Primary Examiner*—David C. Nelms
*Assistant Examiner*—Huan Hoang
*Attorney, Agent, or Firm*—Oblon, Spivak, McClelland, Maier & Neustadt, P.C.

[57] ABSTRACT

A plurality of memory cells are arranged at crosspoints between a plurality of word lines and a plurality of bit lines. The memory cells include not only normal cells but also spare cells for saving defects. The saving of the defect is effected by replacing the word line or bit line connected to the normal cell with the word line or bit line connected to the spare cell. The replacement is effected by a corresponding pair of fuse circuit and deciding circuit, that is, the fuse circuit for storing the address of a word line or bit line to be replaced and the deciding circuit for, based on the address, deciding whether or not an accessed word line or bit line be replaced. As such a pair use is made of a plurality of pairs and a plurality of kinds are provided as the word lines or bit lines for replacement and can be used in accordance with the size of defects. It is, therefore, possible to effectively save the defective word line or bit line, while avoiding any uneffective replacement.

26 Claims, 13 Drawing Sheets

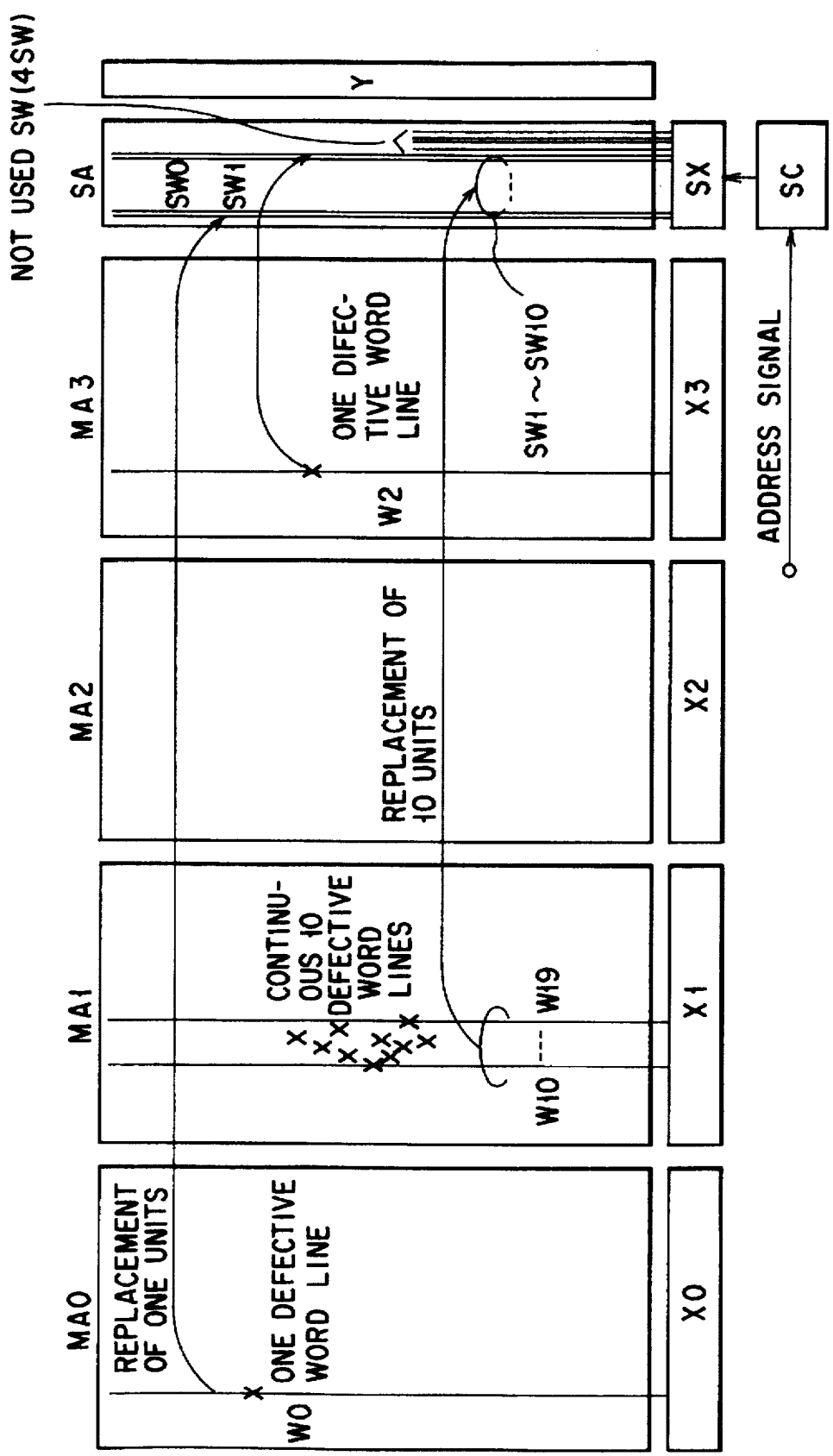
F I G. 7

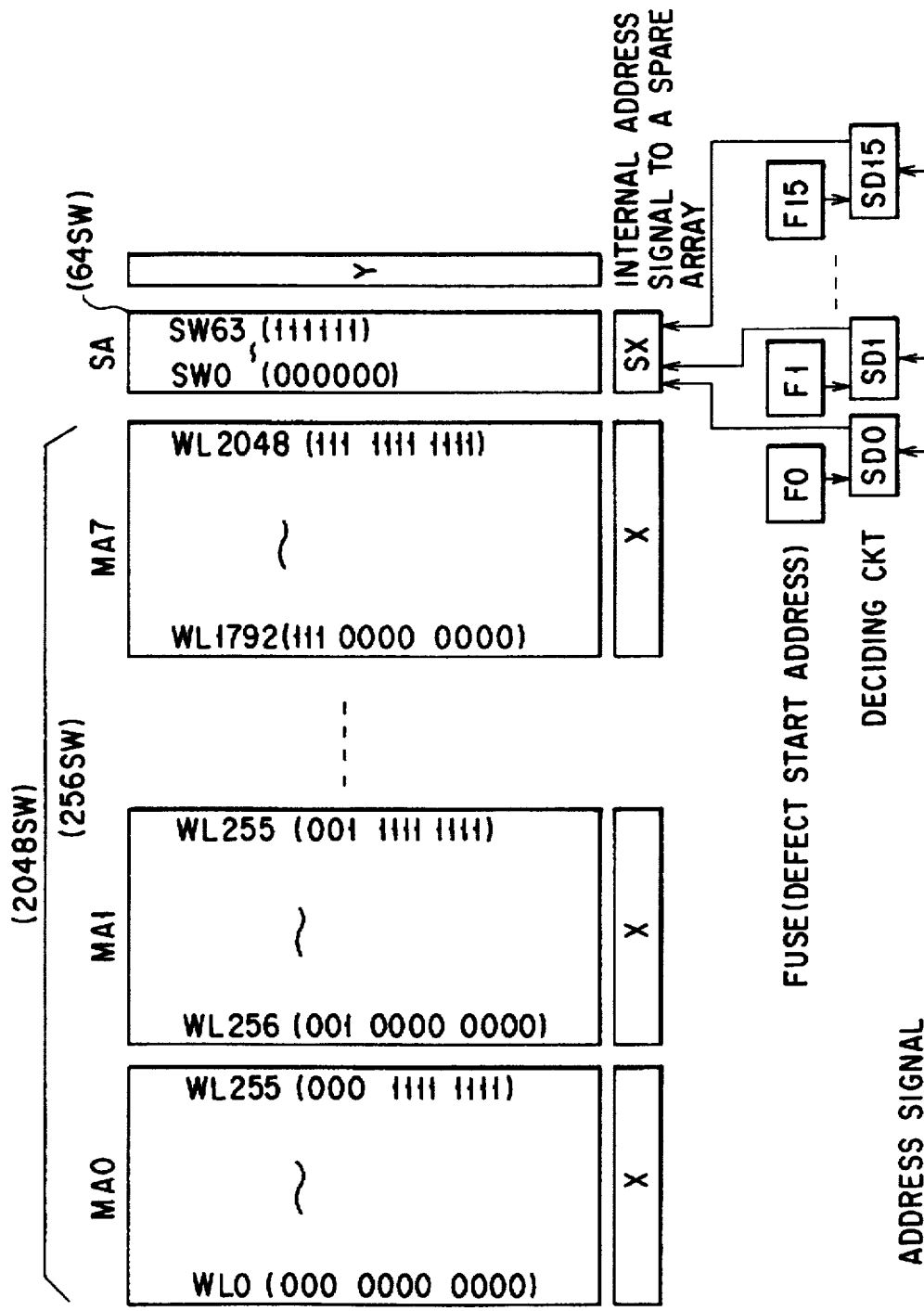
F I G. 17

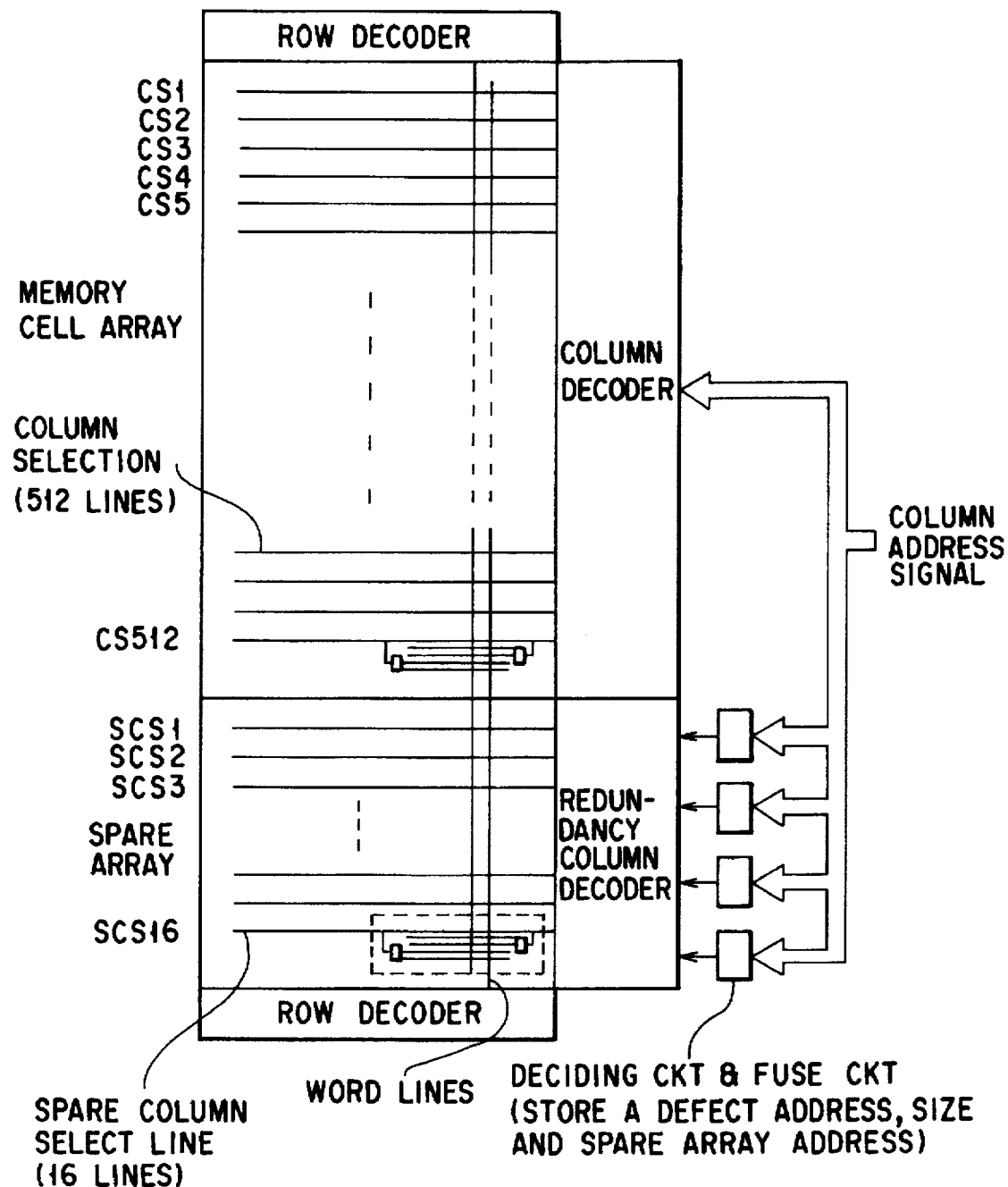
F I G. 18

SEMICONDUCTOR MEMORY DEVICE

BACKGROUND OF THE INVENTION

1. Field of the Invention

The present invention relates to a semiconductor memory device and, in particular, to a semiconductor memory device equipped with a function for saving defects in a memory cell array.

2. Description of the Related Art

A recent advance in the semiconductor microfabrication technique has achieved an enhanced integration density in a dynamic type semiconductor memory device (DRAM), that is, 4M and 16M bits class DRAMs in a mass production and 1G bit class DRAM in a research and development stage. However, as the integration density is enhanced with a decrease in a fabrication pitch of, for example, interconnect lines in a chip, shorting between the interconnect lines is liable to occur due to a dust in a clean room or a variation in a work process, a charge retaining characteristic of a memory cell falls. Consequently it is more likely increasing a defect occurs in the memory cells. Further, the area of the semiconductor chip is gradually increasing with generations, the probability that a defect is contained in the memory chip becomes higher and higher. For this reason, a yield will be prominently lowered without any saving circuit for replacing defective parts with normal ones.

Since the saving circuit requires many circuit elements, such as spare (redundant) memory cells which replace the defective memory cells and deciding circuitry which detects the access to the defective cells and decide to replace the activation of the defective cells with that of the normal cells, it will increase the chip area.

Various saving circuits have conventionally been proposed so far. FIG. 1 shows the most basic conventional saving circuit for replacing a defective word line with a spare word line (redundancy word line). Two spare word lines ($SW_{00}$, $SW_{01}$; $SW_{10}$, $SW_{11}$; $SW_{20}$, $SW_{21}$; and $SW_{30}$, $SW_{31}$) are added to each of four memory cell arrays ($MA_0$, $MA_1$, $MA_2$ and $MA_3$). A deciding circuit ($SD_0$, $SD_1$, $SD_2$, $SD_3$, $SD_4$, $SD_5$, $SD_6$ and $SD_7$) is attached to the corresponding one of the eight spare word lines.

A defect created in the array is saved by replacing a corresponding word line across the defect site with the spare word line. In the memory cell array $MA_0$, for example, a defective word line $W_0$ is replaced by the deciding circuit $SD_0$ with the spare word line $SW_{00}$ and a defective word $W_1$ by a corresponding deciding circuit with the spare word line $SW_{01}$. In the memory cell array $MA_1$, for example, a defective word line $W_2$ is replaced by the deciding circuit $SD_2$ with the spare word line $SW_{11}$. In the memory cell array $MA_2$, for example, a defective word line $W_3$ is replaced by the deciding circuit $SD_4$ with the spare word line $SW_{20}$.

When access is gained to the defective word line, the spare word line is activated instead of activating the defective word line. In this example, it is possible to replace any two defective word lines with the spare word lines in the respective array.

In a circuit as shown in FIG. 2, in order to decrease the area occupied by a saving circuit, a deciding circuit ($SD_0$, $SD_1$, $SD_2$, $SD_3$) is shared among four memory cell arrays ($MA_0$, $MA_1$, $MA_2$, $MA_3$), resulting that the number of deciding circuits decreases. This saving circuit can save two defective word lines in one memory cell array as in the case of the FIG. 1 circuit. However, it is possible to save only four defective word lines in all four arrays.

In a saving circuit shown in FIG. 3, one spare memory cell array is provided in addition to four memory cell arrays. In this saving circuit, four deciding circuits are shared among the four memory cell arrays as in the case of FIG. 2 and it is possible to save four defective word lines in any of four memory cell arrays. Therefore, the saving efficiency of this circuit is found to be higher than that of the FIG. 2 circuit where it is possible to save at most two defective word lines for one memory cell array.

The conventional examples as set out above are tantamount to replacing one defective word line with one spare word line in one deciding circuit. In actual practice, however, defects tend to continuously occur among adjacent word lines and, for this reason, some prior art method comprises making replacements in units of plural of word lines, four word lines for example.

FIG. 4 shows the prior art circuit adopting this method. The method of FIG. 4 uses four deciding circuits SD0, SD1, SD2, SD3 and 16 spare word lines (four SWs ×4). The deciding circuits handle four spare word lines SWs and can replace, with spare word lines, four word lines containing at least one defective word line.

In this system, since the saving of 16 word lines is handled by four deciding circuits, it is possible to decrease the number of deciding circuits and to suppress an increase in chip area. In comparison to the system of one desiding circuit handles one word line. But following problem arises in this system.

In the circuit shown in FIG. 4, since the spare word lines are limited to four saving units, there arises a lower saving efficiency problem that, if one word line is defective for instance, the remaining three normal word lines are replaced with the spare word lines. Further, the circuit of FIG. 4 also produces the following problem. Here it is assumed that, as shown in FIG. 5, three defective sites are produced with one word line defective at two of these three sites and ten word lines collectively at the remaining one site. In this case, although the defective word lines are 12 in all and less than the 16 spare word lines and, further, the defective sites are three in all and less than the total of four deciding circuits, it is not possible to save all these defective word lines. That is, the number of word lines to be replaced through the deciding circuits is fixed to four and three deciding circuits are necessary to save the collective ten defective word lines. If, in the above-mentioned case, the one defective site is saved by the remaining one deciding circuit, it is not possible to save the remaining one site. As evident from the above, even where the number of defective sites is less than a total number of deciding circuits, there occurs the situation under which all the defective word lines involved cannot be saved.

This problem can be solved by handing one defective word line by one deciding circuit for saving purpose. In this method, however, it is necessary to prepare the same number of deciding circuits as that of spare word lines. Consequently, more deciding circuits and more chip area are required.

In the prior art as set out above, where one deciding circuit handles one defective word line for saving purpose, the saving efficiency is best, but the problem arises because there is a need to increase the number of deciding circuits and hence increase the chip area. Where, on the other hand, one deciding circuit handles a plurality of defective word lines for saving purpose, it is possible to decrease the number of deciding circuits and hence to suppress an increase in chip area. However, in spite of other sites being normal, the defective word lines are replaced together with other spare word lines not required for saving purpose, thus lowering the saving efficiency.

SUMMARY OF THE INVENTION

It is accordingly the object of the present invention to provide a semiconductor memory device which can suppress an increase in chip area and achieve an improved saving efficiency for defects.

According to the first aspect of the present invention, a plurality of memory cells arranged at crosspoints between a plurality of word lines and a plurality of bit lines, the memory cells including normal and spare memory cells; and a plurality of replacing means for replacing at least one word line or bit line connected to the normal memory cells with at least one word line or bit line connected to spare memory cells of the same number of the normal memory cells to be replaced, wherein a plurality of kinds of numbers of replaced memory cells are set so as to effect replacement through the plurality of replacing means.

According to the second aspect of the present invention, a plurality of memory cells arranged at crosspoints between a plurality of word lines and a plurality of bit lines, the memory cells including a plurality of normal cells and a plurality of spare cells;

at least one first replacing means for replacing at least one word line or bit line connected to the normal memory cells of first number with at least one word line or bit line connected to the spare memory cells of the first number; and at least one second replacing means for replacing at least one of a word line or bit line connected to the normal memory cells of second number with at least one word line or bit line connected to the spare memory cells of the second number, wherein the first number of memory cells to be replaced by the first replacing means and the second number of memory cells to be replaced by the second replacing means are fixed and the second number of memory cells to be replaced by the second replacing means is greater than the first number of memory cells to be replaced by the first replacing means.

According to the third aspect of the present invention, a plurality of memory cells arranged at crosspoints between a plurality of word lines and a plurality of bit lines, the memory cells including a plurality of normal cells and plurality of spare cells; and a plurality of replacing means for replacing at least one word line or bit line connected to the normal cells with at least one word line or bit line connected to spare cell, wherein the number of units to be replaced through the replacing means is variable.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 7 is a view showing a main section of a semiconductor memory device according to a first embodiment of the present invention;

FIG. 17 is a view showing a main section of a semiconductor memory device according to a fifth embodiment of the present invention;

FIG. 18 is a view showing a main section of a semiconductor memory device according to a sixth embodiment of the present invention.

DETAILED DESCRIPTION OF THE PREFERRED EMBODIMENTS

Figure 1:
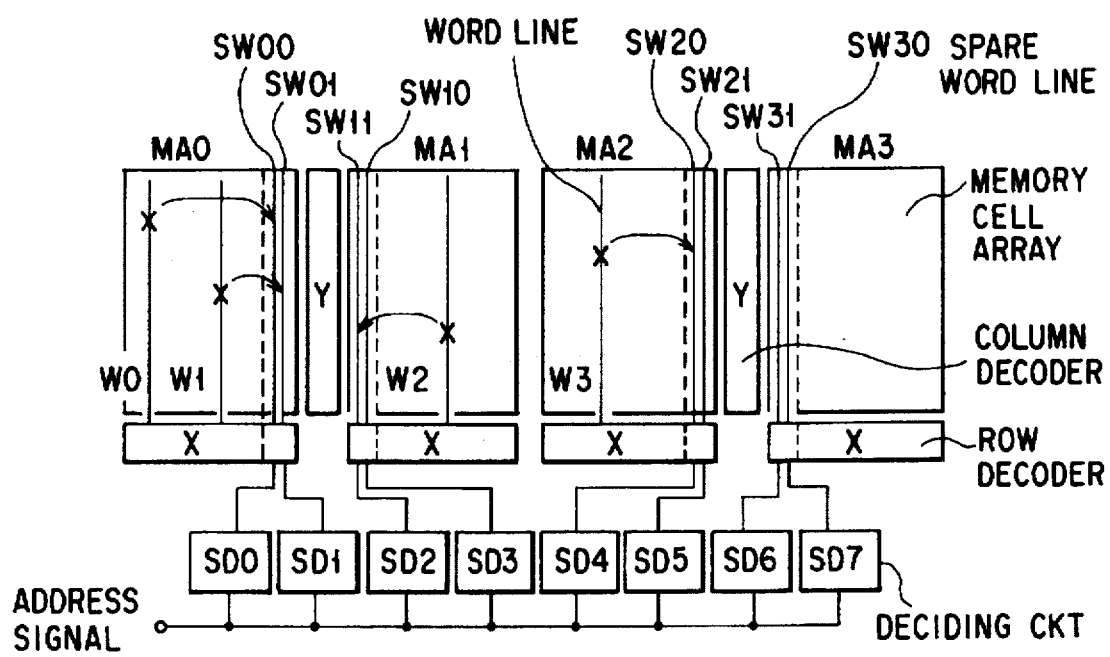
FIG. 1 is a view showing a main section of a first semiconductor memory device according to the prior art of FIG. 1.
Figure 2:
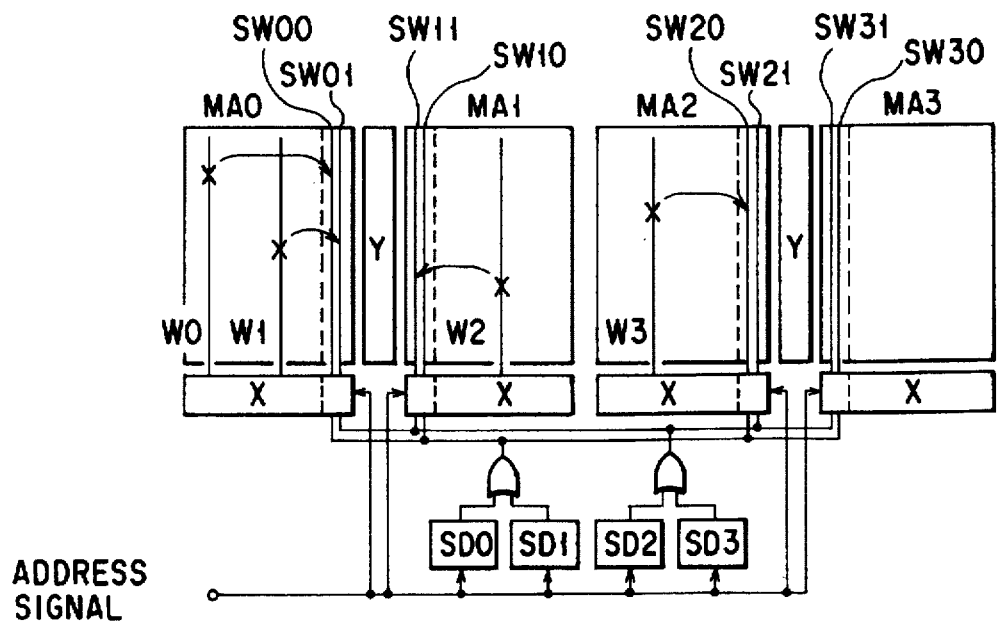
FIG. 2 is a view showing a main section of a second semiconductor memory device according to the second prior art of FIG. 2.
Figure 3:
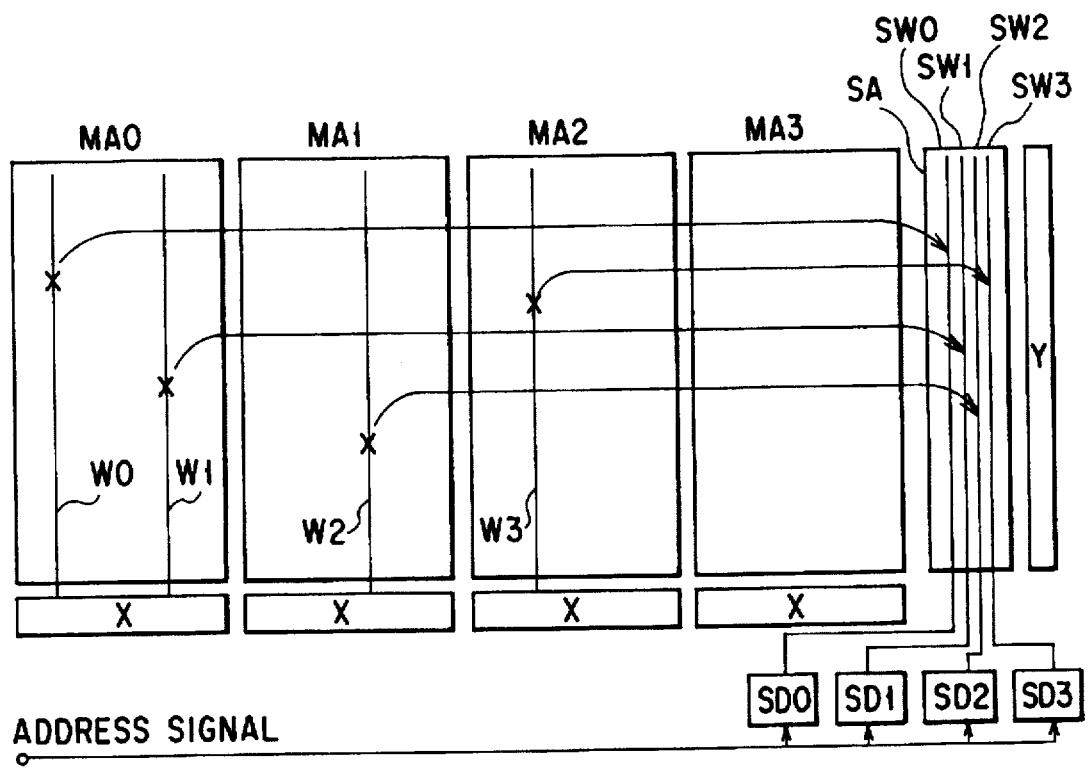
FIG. 3 is a view showing a main section of a third semiconductor memory device according to the prior art of FIG. 3.
Figure 4:
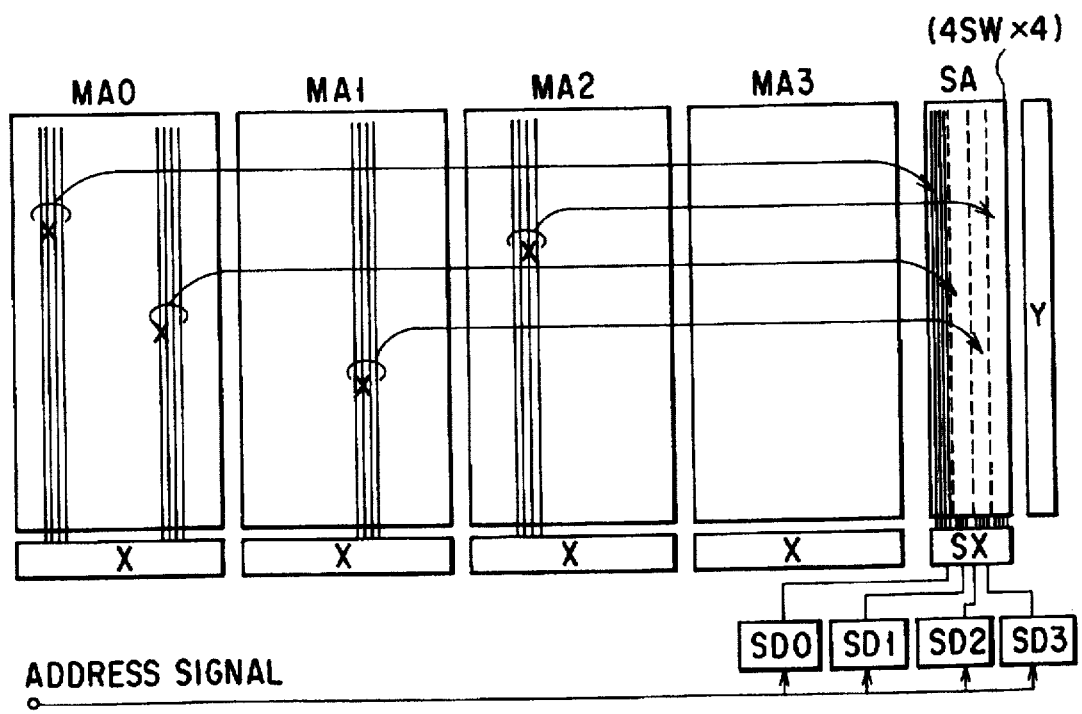
FIG. 4 is a view showing a fourth semiconductor memory device according to the prior art of FIG. 3.
Figure 5:
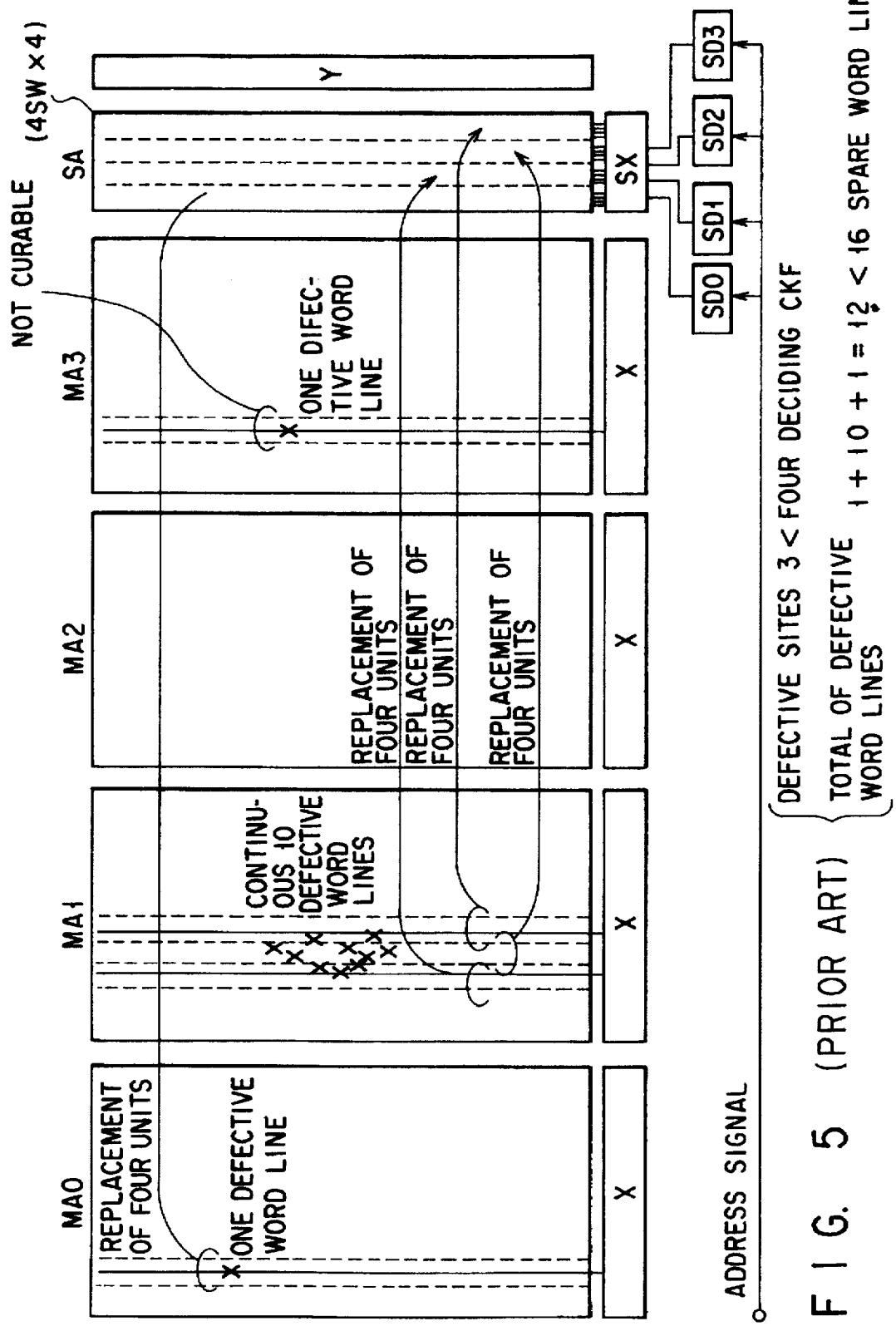
FIG. 5 is an explanatory view showing the problems encountered in the fourth semiconductor memory device.
Figure 6:
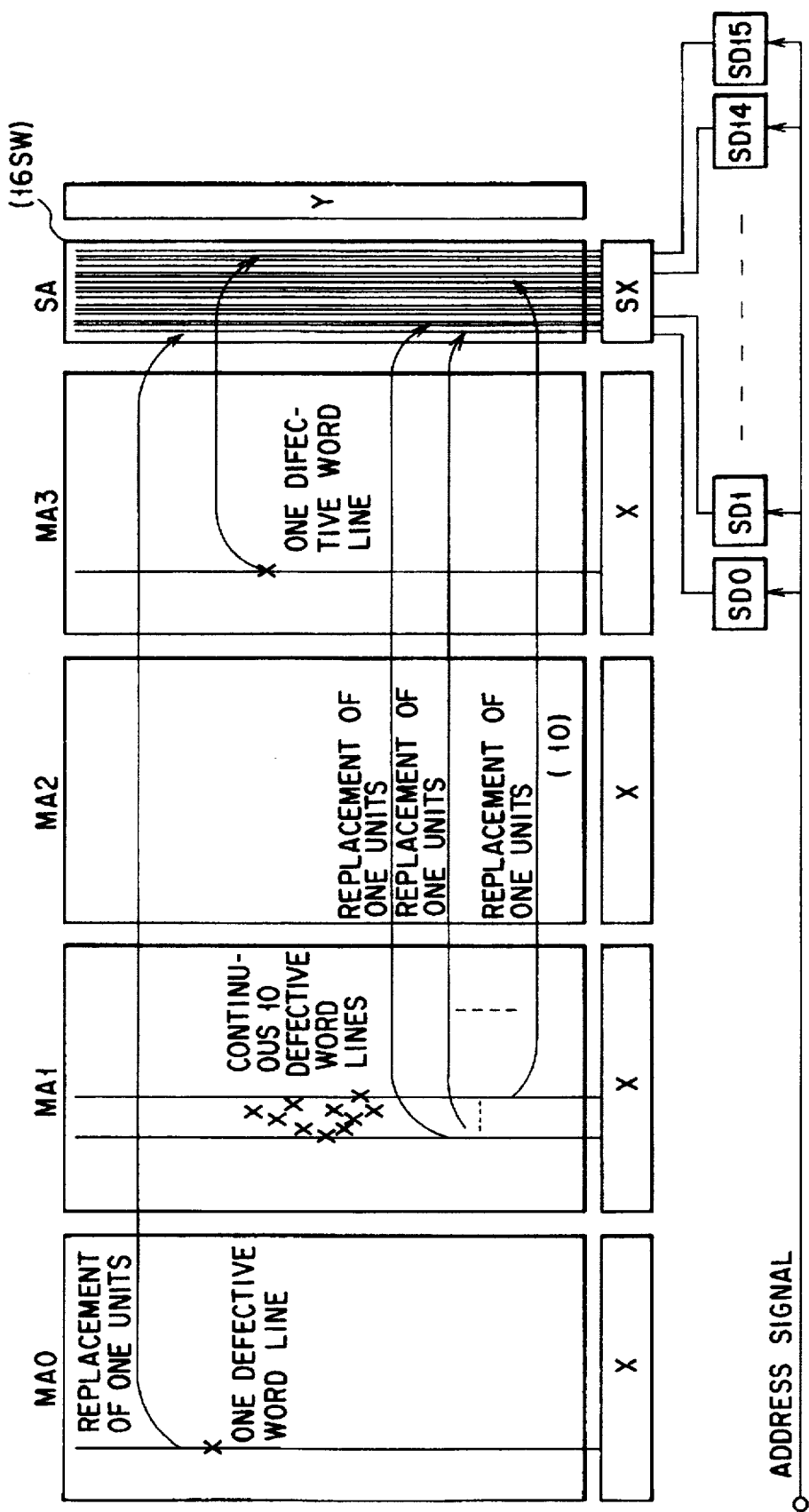
FIG. 6 is a view showing a main section of a fifth semiconductor memory device according to the prior art.

The embodiments of the present invention will be explained in more detail below with reference to the accompanying drawings.

(First Embodiment)

FIG. 7 is a view showing a main arrangement of a semiconductor memory device according to a first embodiment of the present invention. In the arrangement shown, normal memory cell arrays (MA0, MA1, MA2, MA3) are provided together with a spare memory cell array (redundancy memory cell array) SA for saving defects in the memory cell arrays. The memory cell arrays (MA0, MA1, MA2, MA3), each, comprise a plurality of word lines W, a plurality of bit lines, and a plurality of memory cells arranged at crosspoints between the word lines and the bit lines.

In these memory arrays, a breakage at the word and bit lines, leakage in the capacitors of the memory cells, etc., occur randomly at a plurality of sites, thus failing to read data from the affected memory cells. These defects are saved by individually replacing any defective word line connected to normal cells with a normal spare word line, individually replacing any defective bit line connected to normal cells with a normal spare bit line, or replacing both the word and bit lines. Here, explanation will be given about saving defects by replacing the word line, noting that the defects may be saved by replacing the defective bit line or replacing both the word and bit lines.

The defective site as set out above contains at least one defective word line. Or a continuous defective area occurs in one site at adjacent word lines. In this connection it is to be noted that the size of one defective site is indicated by the number of those defective word lines thereacross.

In order to save such defects, a spare memory cell array SA is provided. The spare memory cell array SA comprises a plurality of (16 for example) spare word lines (SW0, SW1, SW2, ..., SW15), a plurality of bit lines shared among normal memory cell arrays, and a plurality of spare memory cells provided at crosspoints between the spare word lines and bit lines.

The memory cells are, for example, one transistor/one capacitor DRAM cells and all are arranged at crosspoints between the word and bit lines for an open BL system or selectively arranged at crosspoints between word and bit lines for a folded BL system.

A column decoder Y is provided to select a to-be-accessed bit line specified by an address signal. Row decoders (X0, X1, X2, X3) selectively activate a to-be-accessed word line specified by an address signal. A spare row decoder SX selectively activates a spare word line selectively specified by an address signal from a saving circuit SC.

The saving circuit SC is of such a type that, when access is gained to the defective word line, an address signal (saving address signal) for specifying a spare word line for replacing the defective word line is supplied to the spare row decoder SX.

The replacement of the word line through the saving circuit SC is effected at a respective defective site. That is, if one defective word line is across the defective site, it is replaced with one spare word line SW0. If 10 defective word lines are across the respective defective sites, 10 defective word lines (W10, W11, W12, ..., W19) are replaced with spare word lines (SW1, SW2, SW3, ..., SW10).

Although, in the above-mentioned embodiment, the saving circuit SC is not shown in detail, it may be said that, in accordance with the number of defective word lines across the defective sites, they can be variably replaced as in the case of later-described respective embodiments.

(Second Embodiment)

Figure 8:
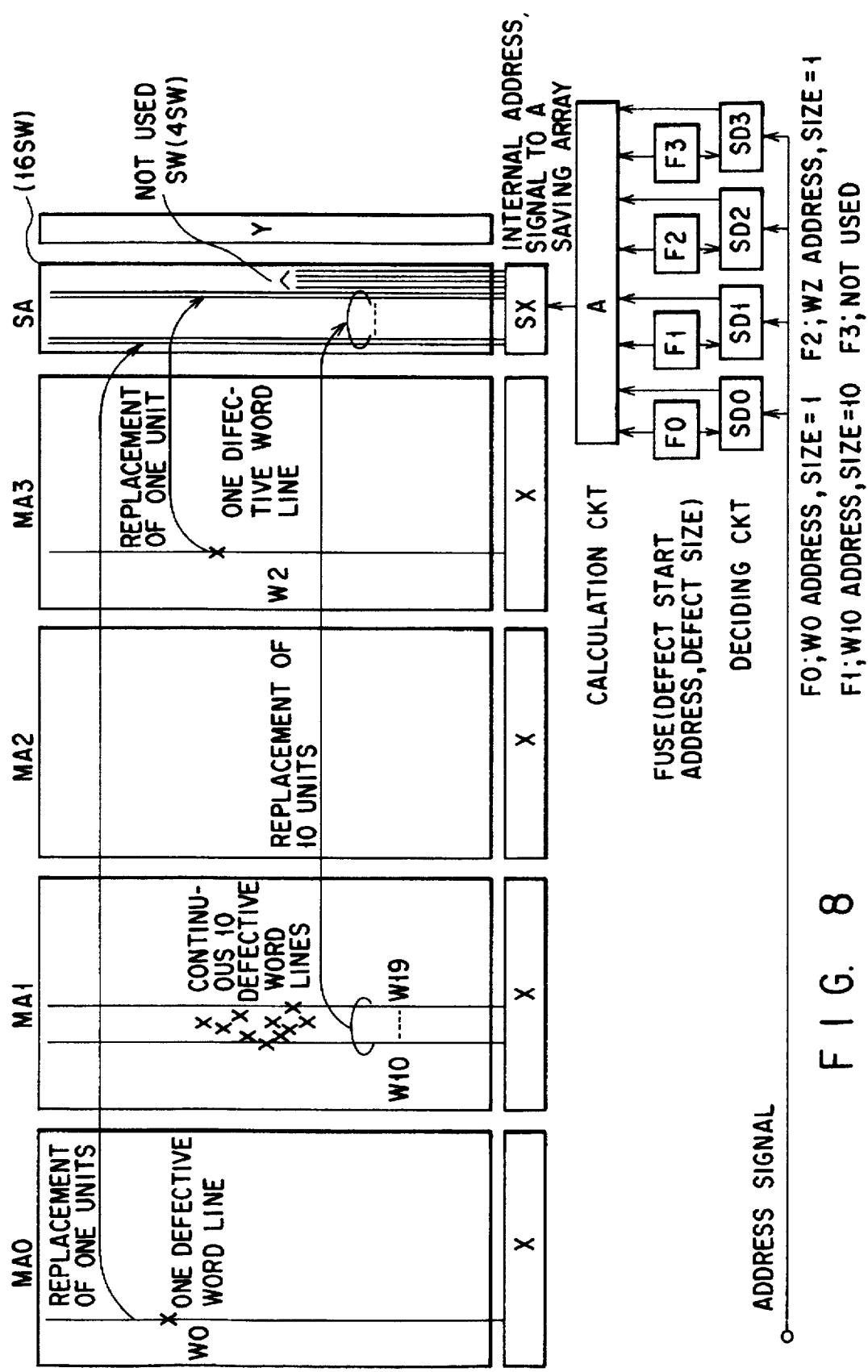
FIG. 8 is a view showing a main section of a semiconductor memory device according to a second embodiment of the present invention.

FIG. 8 is a view showing the main arrangement of a semiconductor memory device according to a second embodiment of the present invention. The second embodiment shows a practical embodiment of a saving circuit for saving defects by replacing defective word lines with spare word lines as set out in connection with the first embodiment.

The arrangement of normal memory cell arrays (MA0, MA1, MA2, MA3) and spare memory cell arrays SA of the present embodiment is the same as in the first embodiment.

The saving circuit comprises a plurality of (four for example) deciding circuits (SD0, SD1, SD2, SD3), a plurality of (four for example) fuse circuits (F0, F1, F2, F3), and a calculation circuit A. These deciding circuits, each, are provided to decide whether or not a to-be-accessed word line specified by an address signal be replaced with the spare word line. The fuse circuits constitute nonvolatile memories and store defect information required for decision by the respective decision circuit.

The four decision circuits and corresponding fuse circuits constitute paired circuits. That is, the deciding circuits SD0, SD1, SD2 and SD3 receive defect information from the fuse circuits F0, F1, F2 and F3, respectively, to make decision for defects. A first pair of decision SD0 and fuse circuit F0 stores defect information on a first defective site and makes decision on the first defective site. A second pair of decision circuit SD1 and fuse circuit F1 stores defect information on the second defective site and makes decision on the second defective site. A third pair of decision circuit SD2 and fuse circuit F2 stores defect information on the third defective site and makes decision on the third defective site. The fourth pair of decision circuit SD3 and fuse circuit F3 stores defect information on the fourth defective site and makes decision on the fourth defective site.

The defect information stored in the fuse circuits (F0, F1, F2, F3) contains an address (start address) on a specific one of a plurality of defective word lines across defective sites to be saved thereby, not those address on all defective word lines across defective sites to be saved thereby, and defect size, that is, the number of the defective word lines across the defective sites. The term "a specific one" means that end word line of defective word lines across the same defective site where, for example, the defect starts. According to such defect information, it is possible to recognize the position of a specific defective word line located from a first defective word line and hence to make defect decision in the same way as if the addresses of all defective word lines were stored.

The defect information is acquired by an operation test of a chip for the defect of word lines after manufacture and written to the fuse circuits (F0, F1, F2, F3). This write operation is effected by selectively cutting off a plurality of connection lines (fuses) by a laser beam.

The present invention will be explained in more detail below in conjunction with the embodiment of FIG. 8. In this example, three defective sites occur in the four memory cell arrays (MA0, MA1, MA2, MA3) where one word line W0 is defective at one site (first defective site), adjacent ten word lines W10, W11, W12, ..., W19 are continuously defective in another site (second defective site) and one word line W2 is defective in a remaining site (third defective site).

In this case, the fuse circuit F0 stores an address of the defective word line W0 across the first defective site and defect size "1". The fuse circuit F1 stores the address of the end defective word line W10 of the defective word lines W10 to W19 across the second defective site and defect size "10". Further, the fuse circuit F2 stores the address of the defective word line W2 across the third defective site and defect size "1".

The deciding circuit SD0 receives defect information on the first defective site from the fuse circuit F0 and decides whether or not an accessed word line is defective. The deciding circuit SD1 receives defect information on the second defective site from the fuse circuit F1 and decides whether or not an accessed word line is defective. The deciding circuit SD2 receives defect information on the third defective site from the fuse circuit F2 and decides whether or not an accessed word line is defective.

When any one of the deciding circuits (SD0, SD1, SD2) decides that the accessed word line is defective, defect size information on all the defective sites are supplied from the deciding circuit (SD0, SD1, SD2, SD3) to the calculation circuit A. Of those corresponding to a plurality of defective word lines across the defective sites, any specific defective word line access position information as to which defective word line is accessed at a specific position is supplied from the corresponding deciding circuit to the calculation circuit A.

In accordance with the received information, the calculation circuit A allocates a spare word line for saving the defective word line to be accessed. The allocation is sequentially effected to the defective word line W0, W10 to W19, and W2 from the end spare word line SW0 in the spare memory cell so that no waste space is created in the spare memory cell array. That is, the spare word line SW0 is allocated to the defective word line W0 in the first defective site. Further, to the continuous ten defective word lines W10 to W19 in the second defective site, second spare word lines SW1 to 11-th are allocated. To the defective word line W2 in the third defective site, a twelfth spare word line SW11 is allocated.

The calculation circuit A creates an address signal (saving address signal) for specifying an allocated spare word line and a saving address signal is supplied to a spare row decoder SX. The row decoder SX selectively activates a spare word line in the spare memory cell array in accordance with the saving address signal from the calculation circuit A. In this way, the defective word line is replaced with a normal spare word line.

FIGS. 9 to 14 show an explanative view showing the fuse circuit. Here, after the fabrication of a chip, a fuse element is partially cut off with the use of a fuse element or ion focusing beam (FIB) and an address coincidence is detected, for example, with the use of the cut-off or not cut-off information.

Figure 9:
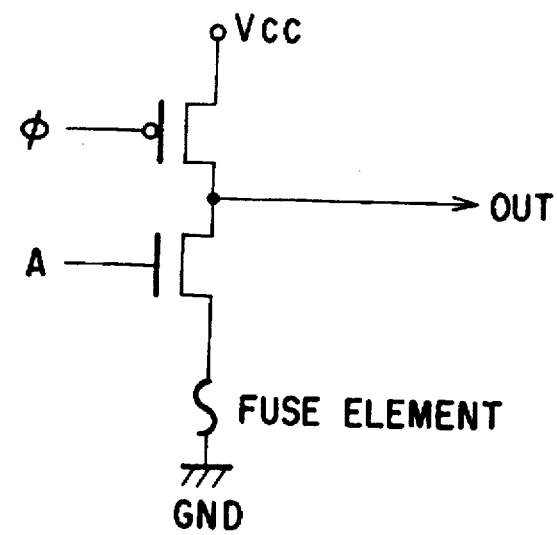
FIG. 9 is a view showing a fuse component corresponding to a 1 bit in a fuse circuit of FIG. 8.

FIG. 9 shows a circuit of one fuse component. One fuse component provides one-bit information. The fuse circuits (F0, F1, F2, F3) have a plurality of fuse components to store the above-mentioned defective information in multi-bit form. p MOS transistor and n MOS transistor are connected in a series array. The p MOS transistor is connected at its source to a power supply Vcc and a fuse element is inserted between the source of the n MOS transistor and a ground potential Vss. The drains of these two transistors are connected in common with an output node OUT.

A control signal φ is supplied from a controller to the gate of the p MOS transistor and an address signal A is supplied to the gate of the n MOS transistor. In a ready state, the control signal φ is placed in a "L" (Vss) level and the address signal A is fixed to the "L" level whereby an output node OUT is precharged to a "H" (Vcc) state.

Figure 10:
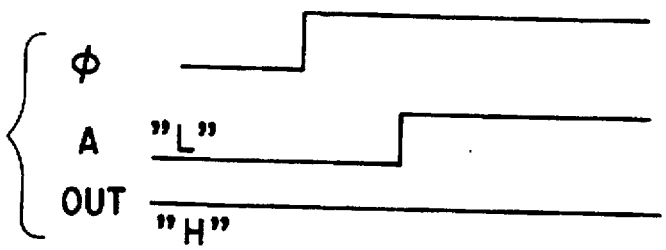
FIG. 10 is a view showing the operation of a fuse component of FIG. 9 when a fuse element is cut.
Figure 11:
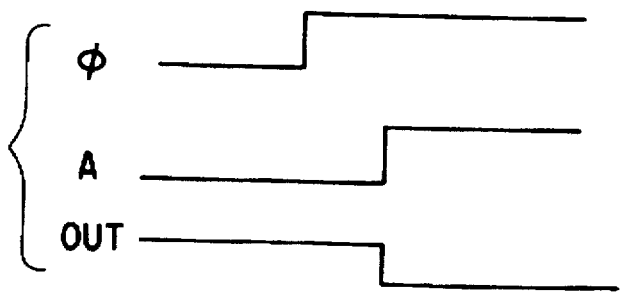
FIG. 11 is a view showing the operation of the fuse component of FIG. 9 when the fuse element is cut off.

At an operation time (at the address deciding time), the control signal φ is changed to a "H" level and the address signal A is changed to the "H" level. At this time, if the fuse is not cut off, electric charge stored in the output node OUT flows into ground because the signal A become the "H" level to render the n MOS transistor ON. As a result, the output node OUT is changed to the "L" level (FIG. 11). If, on the other hand, the fuse is cut off, a potential on the output node OUT is not varied and stays at the "H" level (FIG. 10). When, in this way, the fuse is cut off, the potential on the output node OUT becomes the "H" level and, when the fuse is not cut off, the potential on the output node OUT becomes the "L" level.

Figure 12:
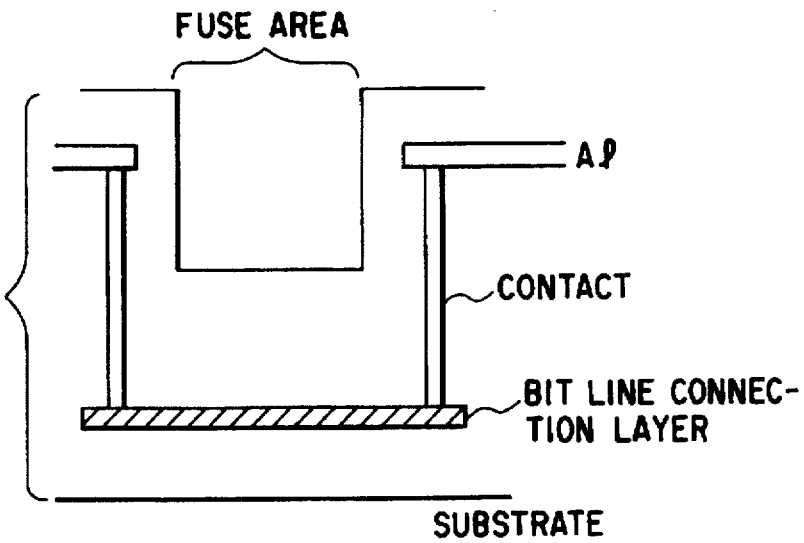
FIG. 12 is a cross-sectional view showing the fuse element of FIG. 9.
Figure 13:
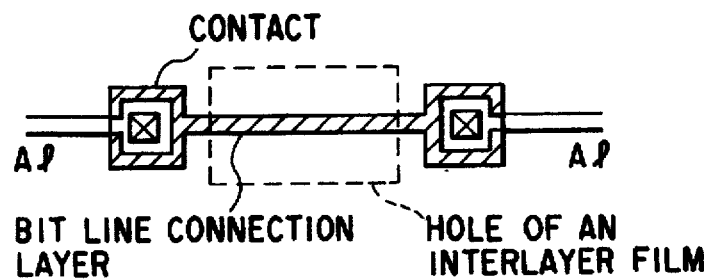
FIG. 13 is a plan view showing the fuse element of FIG. 9.

FIG. 12 is a cross-sectional view of the fuse element and FIG. 13 is a plan view of the fuse element.

Figure 14:
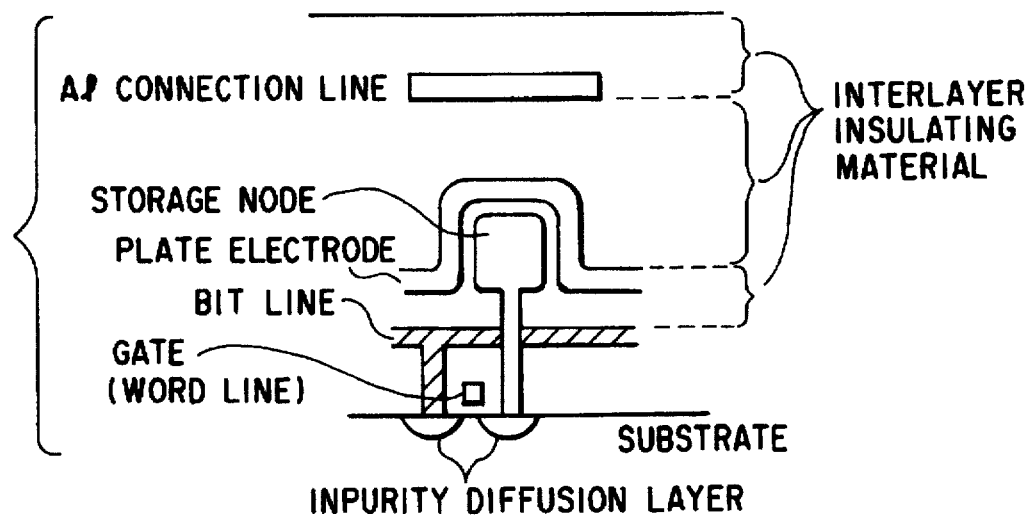
FIG. 14 is a plan view showing a memory cell.

FIG. 14 is a cross-sectional view showing a memory cell. As the fuse element, the bit line of the memory cell is utilized. In order to cut off the fuse element readily by, for example, a laser beam, an interlayer insulating material is cut thin from the surface of the interlayer insulating material to the fuse element.

It is to be noted that the fuse element cuttable by, for example, the laser beam can be formed with an Al material in FIG. 14. If the integration process includes the deposition of other metals, such as copper, the fuse material can be that metal.

According to the present invention, the deciding circuit is shared among the four memory cell arrays to allow a decrease in occupied area of the deciding circuit and hence an area increase by the saving circuit can be suppressed because less number of (four) deciding circuits is provided for all the number of (16) spare word lines. Further, since the pair of deciding circuit and fuse circuit can handle a plurality of defective word lines across one defective site for saving purpose and the saving number can be varied, only defective word lines can be effectively saved. If, therefore, the number of defective sites is within the four (all the numbers) deciding circuits and all the number of defective word lines is within the 16 (all the numbers) spare word lines, then it is possible to positively save all the defective word lines. That is, it is possible to effectively improve the saving efficiency without the need to increase an occupation area of the saving circuit, such as the redundancy arrays and defective address deciding circuits, in the chip.

(Third Embodiment)

Figure 15:
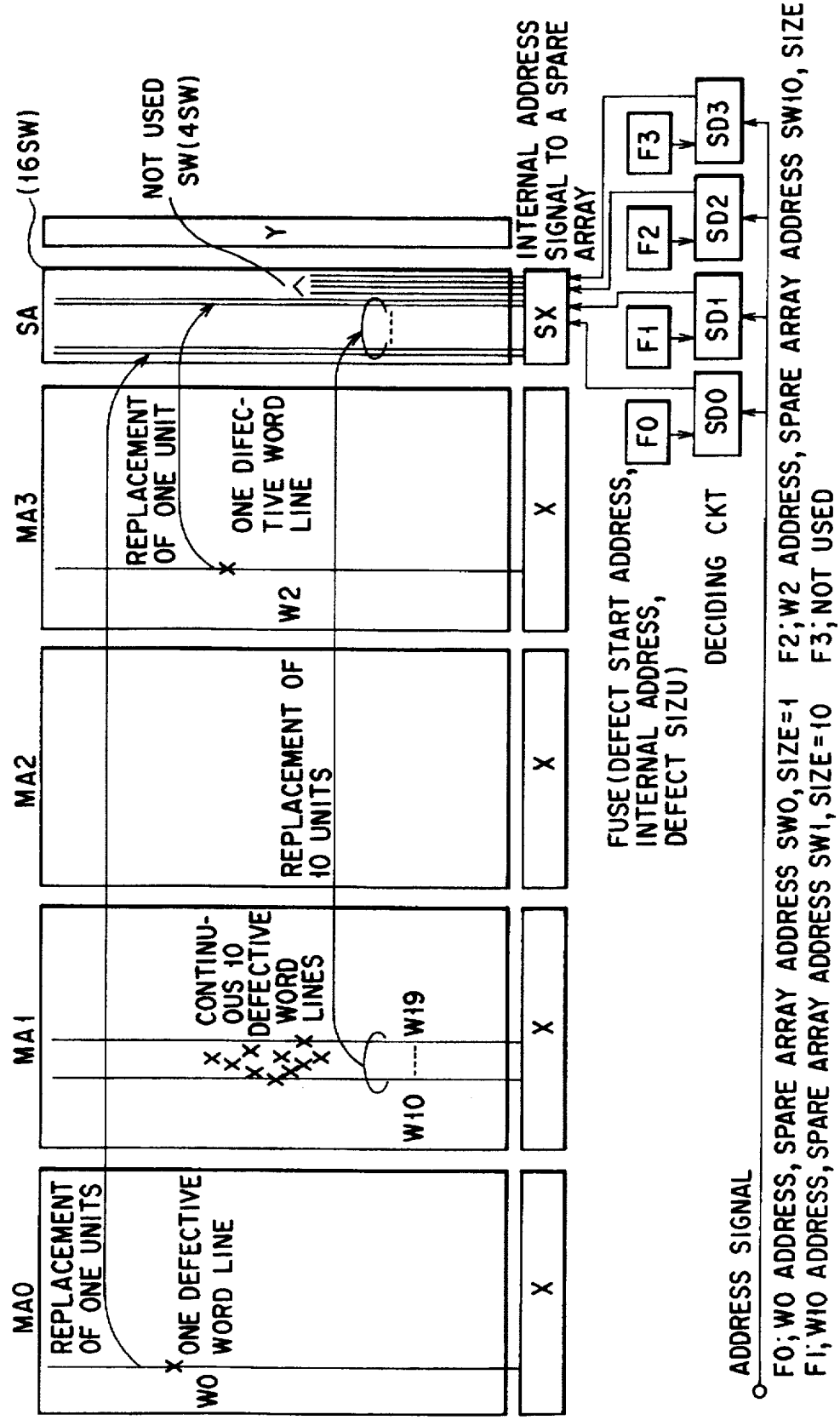
FIG. 15 is a view showing a main section of a semiconductor memory device according to a third embodiment of the present invention.

FIG. 15 shows an arrangement of a main section of a semiconductor memory device according to a third embodiment of the present embodiment.

Like the second embodiment, the third embodiment includes, in addition to normal memory cell arrays (MA0, MA1, MA2, MA3), a spare memory cell array SA for saving defective word lines, so that the defective word lines can be replaced with normal spare word lines. Further, deciding circuits (SD0, SD1, SD2, SD3) is the same as those in the second embodiment.

This embodiment is different from the second embodiment in that the start address information of the defective sites and defect size information, as well as the address information of the spare word lines with which the defective word lines are replaced, are stored in the fuse circuits (F0, F1, F2, F3).

That is, the fuse circuit F0 stores, in addition to the address of a defective word line W0 across a first defective site and defect size "1" information, the information of the address (saving address) of the spare word line SW0 with which the defective word line W0 is replaced. By doing so, if any defective word line W0 is accessed, a corresponding spare word line SW0 can be selectively activated in place of the calculation circuit A of the second embodiment, in which case it is not necessary to provide the calculation circuit A of the second embodiment.

Further, the fuse circuit F1 stores the address of a first one W10 of 10 defective word lines W10 to W19 across the second defective sites, defect size "10" and address (saving address) of a first one SW1 of spare word lines for replacement. By doing so, if access is gained to any of the word lines W10 to W19, a corresponding spare word lines is activated. The fuse circuit F2 stores the address of the defective word line W2 across the third defective site, defect size "1" and address (saving address) of the spare word line SW11. By doing so, if the defective word line W2 is accessed, a spare word line SW11 is activated.

In the present invention, it is not necessary to provide any saving address calculation circuit A set out in conjunction with the second embodiment. As a result, it is of course possible to obtain the same effect as in the second embodiment and to improve the access speed of the spare memory cell array with less circuit area.

(Fourth Embodiment)

Figure 16:
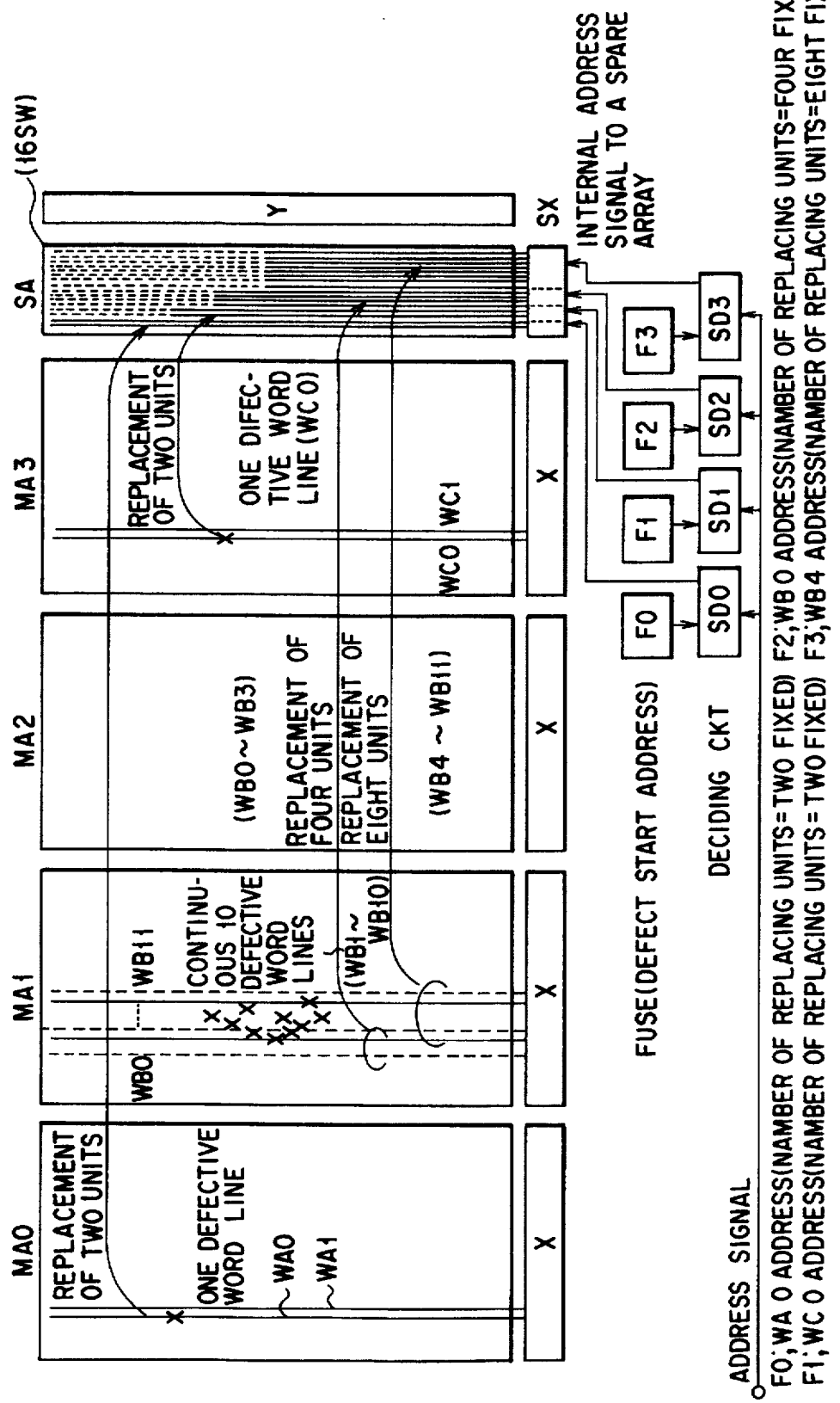
FIG. 16 is a view showing a main section of a semiconductor memory device according to a fourth embodiment of the present invention.

FIG. 16 shows the arrangement of a major section of a semiconductor memory device according to a fourth embodiment of the present invention. In the above-mentioned second embodiment the number of word lines for replacement is variable relative to the pairs of fuse circuit and deciding circuit, while, on the other hand, they are fixed relative to pairs of fuse circuit. In this embodiment, the number of word lines for replacement is not the same among all these pairs and different kinds of values are set in the pairs above.

By the way, defective word lines across defective sites are distributed in a given tendency. The probability of relatively few word lines, such as two or three, being defective across one defective site is relatively high, while the probability of relatively many, such as 10 or 20, word lines being continuously defective across one defective site is relatively low. With these situations in view, in order to decrease the number of normal word lines to be replaced by the defective word lines in spite of being not defective and to improve the same saving efficiency, those pairs having the relatively low fixed values as the replacement number are provided more than those pairs the relatively high fixed values as the replacement number.

In the embodiment shown in FIG. 16, the first pair (SD0, F0) and second pair (SD1, F1) are fixed to two replacement lines, respectively, the third pair (SD2, F2) to four replacement lines and the fourth pair (SD3, F3) to eight replacement lines. In this connection it is to be noted that the number of spare word lines to be handled by the respective pairs can be initially determined because the replacement number is fixed to the respective pairs.

Here, explanation will be given below about the case where defects occur on three of memory cells (MA0, MA1, MA2, MA3), that is, one word line WA0 is defective across the first defective site, one word line WC1 across the second defective site and 10 word lines WB1 to WB10 continuously across third defective site.

The fuse circuit F0 stores the address of a defective word line WA0 across the first defective site. The corresponding deciding circuit SD0 decides whether or not the word line accessed by this address is a defective word line WA0. If the defective word line WA0 is accessed, a spare word line SW0 is activated in place of the defective word line WA0. Further, if the accessed word line is situated at a word line WA1 adjacent to the defective word line WA0, the next spare word line SW1 is activated in place of the word line WA1.

Similarly, defective word line WC0 and adjacent word line WC1 across the second defective site are replaced by the fuse circuit F1 and deciding circuit SD1 with spare word lines SW2 and SW3.

The third defective sites are saved by two pairs, that is, four (WB1, WB2, WB3, WB4) of 10 defective word lines are replaced by the pair of fuse circuit F2 and deciding circuit SD2 with spare word lines SW4, SW5, SW6 and SW7.

In order to save the remaining six defective word lines WB5 to WB10, adjacent eight word lines WB5 to WB12 including these are replaced by the pair of fuse circuit F3 and deciding circuit SD3 with spare word lines SW8 to SW15.

In this way, according to the present invention, the number of word lines handed by the pair of fuse circuit and deciding circuit for replacement is fixed and, further, by setting at least two kinds of pairs handling different number of word lines it is possible to properly utilize the different pairs in accordance with the defect size and to decrease a waste replacement and hence effectively suppress a fall in saving efficiency. Further, according to the present invention, since different kinds of pairs are utilized to handle the different word lines for replacement, that is, the number of word lines for replacement is fixed for the different pairs it is not necessary to use any calculation circuit for calculating each address in the spare memory cell array as set out in the second embodiment and any fuse circuit for storing each address in the spare memory cell array as set out in the third embodiment. It is, therefore, possible to simplify the arrangement of the saving circuit and to achieve a small area.

(Fifth Embodiment)

FIG. 17 shows the arrangement of a main section of a semiconductor memory device according to a fifth embodiment of the present invention. In the present embodiment, one spare memory cell array SA including 64 spare word lines is arranged for eight memory cell arrays MA0 to MA7 including 256 word lines.

The word lines are 2048 in total and the word line is specified by an 11-bit address. Pairs of fuse circuit and deciding circuit are 16 (F0 to F15, SD0 to SD15), respectively, in number and the number of word lines handled by the respective pair for replacement is fixed individually in the case of the fourth embodiment. The deciding circuits SD0 to SD7 each handle one word line for replacement, the deciding circuits SD8 to SD11 handle two word lines for replacement, deciding circuits SD12 and SD13 handle four word lines for replacement and the deciding circuit SD15 handles 16 word lines for replacement.

Further, the deciding circuits have their spare word lines initially determined for replacement. The deciding circuits SD0 to SD7 use the spare word lines SW0 to SW7, the deciding circuit SD8 the spare word lines SW8 and SW9, the deciding circuit SD9 the spare word lines SW10 and SW11, the deciding circuit SD10 the spare word lines SW12 and SW13, and the deciding circuit SD11 the spare word lines SW14 and SW15. Further, the deciding circuit SD12 uses the spare word lines W16 to SW19, the deciding circuit SD13 the spare word lines SW20 to SW23, the deciding circuit SD14 the spare word lines SW24 to SW31, and the deciding circuit SD15 the spare word lines SW32 to SW63.

The fuse circuits F0 to F7 are connected to the deciding circuits SD0 to SD7 for one word line replacement and store 11-bit addresses because each replaces one of 2048 word lines.

The fuse circuits F8 to F11 are connected to the deciding circuits SD8 to SD11 for replacing two word lines at a time and store the upper 10 bit address except for the first one bit. By doing so, the continuous two word lines corresponding to xxx xxx xxx0 to xxx xxx xxx1 (x=0 or 1) as the address of the corresponding word lines in the memory cell array can be replaced by any of the deciding circuits SD8 to SD11.

If the address of the accessed word line coincides with the upper ten bits stored in the fuse circuit, the corresponding saving word line is activated and the selection of the word line in the memory cell is suspended. According to the present invention, the lower 1 bit at that time coincides with the address of the lower 1 bit in the redundancy array.

That is, if replacement is effected by, for example, the deciding circuit SD8, the spare word lines SW8 (address 001000 in the spare memory cell array) and SW9 (similarly address 001001) correspond to the addresses xxx xxx xxx0 and xxx xxx xxx1 of the word lines in the memory cell array and there a coincidence between their lower 1 bits.

The fuse circuits F12 and F13 connected to the deciding circuits SD12 and SD13 for replacing four word lines at a time store the addresses of the upper nine bits except for the lower two bits. By doing so, continuous four word lines corresponding to the addresses xxx xxxx xx00 to xxx xxxx xx11 of the word lines in the memory cell can be replaced by the deciding circuits SD12 or SD13. Further, for the lower two bits, there is a coincidence between the address of the replacing memory cell array and that of the corresponding saving word line.

That is, if such a replacement is to be made by the deciding circuit SD12, the addresses of the word lines are xxx xxxx xx00 to xxx xxxx xx11 and the addresses of the corresponding spare word lines are 010000 to 010011 (SW19). As evident from the above, their lower two bits (00, 11) coincide with each other.

The fuse circuit F14 is connected to the deciding circuit SD14 for replacing eight word lines and the fuse circuit F15 is connected to the deciding circuit SD15 for replacing 32 word lines. In these cases, address decision is made using the upper eight bits and upper six bits in the same way as above. Further, their lower three bit and five bit addresses provide coincidences between the word line address and the spare word line address.

As in the case of the fourth embodiment, the major purport of the fifth embodiment lies in that, unlike the prior art technique for equally allocating any spare word lines in the spare memory cell array to the deciding circuits, the fifth embodiment can improve saving efficiency by effectively allocating the proper number of spare word lines by the pairs of fuse circuit and deciding circuit so as to correspond to a defect occurrence probability. Regarding the row saving, for example, the defect occurrence curable by replacement with one saving word line is probably the most often case and the probability of defect occurrence is decreased with an increase in the number of defective word lines.

In the present embodiment, this situation is taken into consideration. That is, the saving circuits are so distributed as to be eight for one defect unit, four for two defect units, two for four defect units and one for eight defect units. More saving circuits are prepared for smaller defect units and less saving circuits for greater defect units. An actual practical saving unit distribution may be determined depending upon the actual distribution of defect sizes.

Generally, the probability of a relatively small number of defective word lines occurring in the same site is higher than that of a relatively great number of defective word lines occurring in the same site. In the document (U.S. Fed. Std. 209E), for example, it is considered that the dust size distribution in a clean room is proportional to the power −2.2. Given that the dust size is proportional to a defect size, the distribution of the defect is proportional to the power −2.2. As evident from the above, if the saving/curing of one unit is effected, then the probability of a curable defect occurring is the greatest and, with the increasing size, the occurrence probability becomes smaller in exponential fashion. Therefore, it is desirable that, when the number of spare word lines handled by the pair of fuse circuit and deciding circuit becomes double, the number become 2 to the minus x-th power (x>0).

The number of spare word lines handled by the respective pair is $2^m$ (m=an integer), such as 1, 2, 4, 8, . . . This is because, due to the address being represented by the binary number, if the upper address except for the lower three bits is written to the fuse circuit in order to save, for example, eight ($2^3$) units, replacement decision can be readily carried out.

(Sixth Embodiment)

Figure 19:
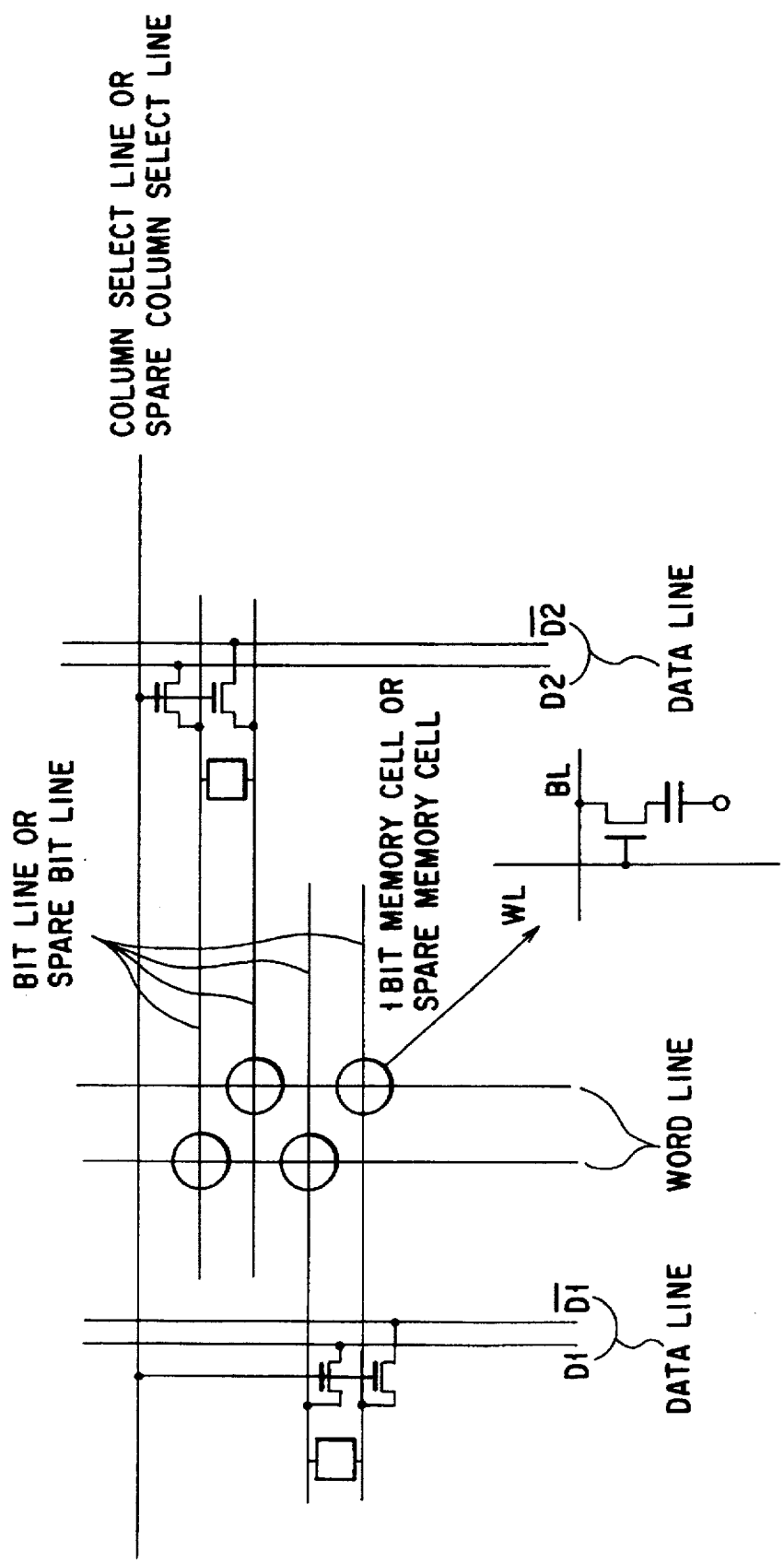
FIG. 19 is an enlarged view showing part of the memory cell array of FIG. 18.

FIG. 18 is an arrangement showing a main section of a semiconductor memory device according to a sixth embodiment of the present invention. FIG. 19 is an expanded view showing part of a memory cell array in FIG. 18. The present embodiment is an example of saving a defect of a bit line, not a word line.

As shown in FIG. 19, four bit lines in two sets are connected respectively to the data lines under control of column select line. In the memory cell array in the present embodiment, 512 column select lines are contained and, thus, 2048 bit lines are contained.

The control of the column select line is effected by a column decoder. A spare memory cell array for defect unit replacement contains 16 spare column select lines and 64 spare bit lines.

The respective column select line or spare column select line controls the connection of four bit lines or four spare bit lines. The control of the spare column select line is made by a redundancy column decoder controlled by four sets of deciding circuit and fuse circuit.

As in the same way as the embodiment for word line replacement, the fuse circuit can store defect addresses, number of column select lines replaced one at a time, and addresses of column select lines in the spare array. If there arises a coincidence between an externally inputting address and a defective site, the defective site is replaced by the spare unit.

As in the embodiment above, an optimal saving unit can be set in accordance with the size of the defective site and it is possible to effectively improve the saving/curing efficiency without unduly increasing the occupation area, in a chip, of a saving circuit such as a redundancy array or defective address deciding circuit.

The present invention is not restricted to the respective above-mentioned embodiment. Although, in the first to fifth embodiments, one redundancy array is provided for four memory cell arrays, the number of memory cell arrays to be handled is not restricted to four and can be properly varied in accordance with the specification used. The fuse circuit of the saving circuit is not only utilized to cut the fuse but also utilized to store the address corresponding to the defective site and the size of a defect. The fuse circuit has only to be of such a type as to be held over a longer period of time. It is also possible to store any defective address, etc., with the use of a nonvolatile semiconductor memory, such as an EEPROM. The present invention can be applied not only to the DRAM but also to EPROM and EEPROM. Various changes or modifications of the present invention can be made without departing from the spirit and scope of the present invention.

Additional advantages and modifications will readily occur to those skilled in the art. Therefore, the invention in its broader aspects is not limited to the specific details, representative embodiments, and shown and described herein. Accordingly, various modifications may be made without departing from the spirit or scope of the general inventive concept as defined by the appended claims and their equivalents.

What is claimed is:

1. A semiconductor memory device comprising
a plurality of memory cells arranged at crosspoints between a plurality of word lines and a plurality of bit lines, the memory cells including normal and spare memory cells; and
a plurality of replacing means for replacing at least one word line or bit line connected to the normal memory cells with at least one word line or bit line connected to spare memory cells of the same number of the normal memory cells to be replaced, wherein
a plurality of kinds of numbers of replaced memory cells are set so as to effect replacement through the plurality of replacing means.

2. The semiconductor memory device according to claim 1, wherein the replacing means comprise a plurality of first replacing means for individually replacing n number of word lines or bit lines and a plurality of second replacing means for individually replacing N number of word lines or bit lines, wherein N>n and the first replacing means is greater in number than the second replacing means.

3. The semiconductor memory device according to claim 1, wherein the number of word lines or bit lines to be replaced by the replacing means is set to $2^m$ where m is an integer.

4. The semiconductor memory device according to claim 3, wherein the replacing means includes a plurality of first replacing means for individually replacing two word lines or bit lines at a time and at least one second replacing means for individually replacing four word lines or bit lines at a time and the first replacing means is greater in number than said at least one second replacing means.

5. The semiconductor memory device according to claim 4, wherein the replacing means further includes at least third replacing means for replacing eight word lines or bit lines at a time.

6. The semiconductor memory device according to claim 5, wherein the replacing means includes a plurality of fourth replacing means for replacing one word line or bit line and the fourth replacing means is greater in number than the first replacing means.

7. The semiconductor memory device according to claim 1, wherein the replacing means has storing means for storing an address of a specific one of the word lines or bit lines to be replaced and deciding means for, based on the stored address and number of units to be replaced, deciding whether or not an accessed word line or bit line be replaced.

8. The semiconductor memory device according to claim 7, wherein the storing means has a plurality of fuse elements to be selectively cut out to allow them to be stored.

9. The semiconductor memory device according to claim 8, wherein the fuse element is formed by the same connection layer as that of the bit line.

10. The semiconductor memory device according to claim 8, wherein the fuse element is formed by an aluminum or copper metal connection layer formed on the bit line.

11. A semiconductor memory device comprises
a plurality of memory cells arranged at crosspoints between a plurality of word lines and a plurality of bit lines, the memory cells including a plurality of normal cells and a plurality of spare cells;
at least one first replacing means for replacing at least one word line or bit line connected to the normal memory cells of first number with at least one word line or bit line connected to the spare memory cells of the first number; and
at least one second replacing means for replacing at least one of a word line or bit line connected to the normal memory cells of second number with at least one word line or bit line connected to the spare memory cells of the second number, wherein
the first number of memory cells to be replaced by the first replacing means and the second number of memory cells to be replaced by the second replacing means are fixed and the second number of memory cells to be replaced by the second replacing means is greater than the first number of memory cells to be replaced by the first replacing means.

12. The semiconductor memory device according to claim 11, wherein the first replacing means is greater in number than the second replacing means.

13. The semiconductor memory device according to claim 11, wherein the first replacing means and second replacing means has memory means for storing an address of a specific one of the word line or bit line to be replaced and deciding means for, based on the stored address and the fixed number of units, deciding whether or not an accessed word line or bit line be replaced.

14. The semiconductor memory device according to claim 11, wherein, when the number of bits necessary to represent one word line or bit line is k, the address of the word line or bit line to be replaced is commonly represented by j1 or j2 bits equal to, or smaller than, k; the first replacing means and second replacing means has storing means for storing the address of j1 or j2 bits equal to, or smaller than k in number; means is provided for, when there arises a coincidence between the address of the stored specific j1 or j2 bits and the specific j1 or j2 bits of the address of an accessed word line or bit line, replacing the accessed word line or bit line and, when there arises no such coincidence with any stored address, effecting no such replacement.

15. The semiconductor memory device according to claim 11, wherein the number of word lines or bit lines to be replaced through the first replacing means and that of word lines or bit lines to be replaced through the second replacing means are set to $2^m$ where m denotes an integer.

16. The semiconductor memory device according to claim 15, wherein the first replacing means individually replaces two word lines or bit lines at a time and the second replacing means individually replaces four word lines or bit lines at a time.

17. The semiconductor memory device according to claim 16, further comprising a plurality of third replacing means for replacing one word line or bit line.

18. The semiconductor memory device according to claim 17, wherein the third replacing means is equal to, or greater than, the second replacing means in number.

19. The semiconductor memory device according to claim 16, further comprising at least one third replacing means for replacing eight word lines or bit lines.

20. The semiconductor memory device according to claim 19, wherein said at least one third replacing means is equal to, or smaller than, the first replacing means in number.

21. The semiconductor memory device according to claim 11, further comprising at least one third replacing means for replacing word lines or bit lines different in number from the number of word lines or bit lines to be replaced through the first replacing means and that of word lines or bit lines to be replaced through the second replacing means.

22. A semiconductor memory device comprising
a plurality of memory cells arranged at crosspoints between a plurality of word lines and a plurality of bit lines, the memory cells including a plurality of normal cells and plurality of spare cells; and
a plurality of replacing means for replacing at least one word line or bit line connected to the normal cells with at least one word line or bit line connected to spare cells of the same number of the normal cells to be replaced, wherein the number of word lines or bit lines to be replaced through the replacing means is variable.

23. The semiconductor memory device according to claim 22, the replacing means has storing means for storing an address of a specific one of the word or bit lines to be replaced and the number of the word line or bit line to be replaced and deciding means for, based on the stored address and number of the lines, deciding whether or not an accessed word line or bit line be replaced.

24. The semiconductor memory device according to claim 22, wherein, when the number of bits necessary to represent one word line or bit line is k, the address of the word line or bit line to be replaced is commonly represented by j bits equal to, or smaller than k; the replacing means has storing means for storing the address of j bits equal to, or smaller than, k in number; means is provided for, when there arises a coincidence between the address of the stored specific j bits and the specific j bits of the address of an accessed word line or bit line, replacing the accessed word line or bit line and, when there arises no such coincidence with any stored address, effecting no such replacement.

25. The semiconductor memory device according to claim 24, wherein the number of j can be properly set for each replacing means.

26. The semiconductor memory device according to claim 22, wherein the replacing means has storing means for storing addresses of the word line or bit line to be replaced, number of the word lines or bit lines to be replaced and addresses replacing word line or bit line and deciding means for deciding, based on the stored address and number, whether or not a word line or bit line to be accessed be replaced with the replacing word line or bit line.

* * * * *